(12) United States Patent
Talwar et al.

(10) Patent No.: US 6,365,476 B1
(45) Date of Patent: Apr. 2, 2002

(54) LASER THERMAL PROCESS FOR FABRICATING FIELD-EFFECT TRANSISTORS

(75) Inventors: Somit Talwar, Palo Alto; Yun Wang, San Jose, both of CA (US)

(73) Assignee: Ultratech Stepper, Inc., San Jose, CA (US)

( * ) Notice: Subject to any disclaimer, the term of this patent is extended or adjusted under 35 U.S.C. 154(b) by 0 days.

(21) Appl. No.: 09/698,670

(22) Filed: Oct. 27, 2000

(51) Int. Cl.[7] .................. H01L 21/336; H01L 21/24
(52) U.S. Cl. .................. 438/308; 438/301; 438/303; 438/305; 438/306; 438/535; 438/530; 438/527; 438/514
(58) Field of Search .................. 438/301, 303, 438/305, 306, 307, 308, 535, 514, 527, 530

(56) References Cited

U.S. PATENT DOCUMENTS

| | | | | |
|---|---|---|---|---|
| 5,270,227 A | * | 12/1993 | Kameyama et al. | |
| 5,399,506 A | * | 3/1995 | Tsukamoto | |
| 5,908,307 A | | 6/1999 | Hawryluk et al. | 438/199 |
| 5,956,603 A | | 9/1999 | Talwar et al. | 438/520 |
| 6,013,546 A | * | 1/2000 | Gardner et al. | 438/231 |
| 6,051,483 A | * | 4/2000 | Lee et al. | 438/530 |
| 6,194,748 B1 | * | 2/2001 | Yu | 257/216 |
| 6,284,630 B1 | * | 9/2001 | Yu | 438/511 |
| 6,287,925 B1 | * | 9/2001 | Yu | 438/301 |
| 6,306,714 B1 | * | 9/2001 | Pan et al. | 438/300 |
| 6,297,117 B1 | * | 10/2001 | Yu | 438/305 |
| 6,309,937 B1 | * | 10/2001 | Lin | 438/305 |

OTHER PUBLICATIONS

Talwar et al., Ultra–Shallow, Abrupt, and Highly Activated Junctions by Low–energy Ion Implantation Technology, Proceedings of the 13th International Conference on Ion Implantation Technology, 1999, pp. 1171–1174.

Talwar, et al., Laser Thermal Processing for Shallow–Junction and Silicide Formation, Proceedings of the SPIE, Microelectronic Device Technology II, vol. 3506, pp. 74–81, 1998.

Goto, et al., Ultra–Low Contact Resistance for Deca–nm MOSFETs by Laser Annealing, IEDM Digest, papar 20.7.1, pp. 931–933, 1999.

Yu, et al., 70nm MOSFET with Ultra–Shallow, Abrupt, and Super–Doped S/D Extension Implemented by Laser Thermal Process (LTP), IEDM Digest, paper 20.4.1, pp. 509–511, 1999.

* cited by examiner

*Primary Examiner*—Matthew Smith
*Assistant Examiner*—V. Yevsikov
(74) *Attorney, Agent, or Firm*—Allston L. Jones

(57) ABSTRACT

A simplified and cost reduced process for fabricating a field-effect transistor semiconductor device (104) using laser radiation is disclosed. The process includes the step of forming removable first dielectric spacers (116R) on the sides (120a, 120b) of the gate (120). Dopants are implanted into the substrate (100) and the substrate is annealed to form an active deep source (108) and an active deep drain (110). The sidewall spacers are removed, and then a blanket pre-amorphization implant is performed to form source and drain amorphized regions (200a, 200b) that include respective extension regions (118a, 118b) that extend up to the gate. A layer of material (210 is deposited over the source and drain extensions, the layer being opaque to a select wavelength of laser radiation (220). The layer is then irradiated with laser radiation of the select wavelength so as to selectively melt the amorphized source and drain extensions, but not the underlying substrate. This causes dopants in the deep source to diffuse into the molten source extension, and dopants in the deep drain to diffuse into the molten drain extension. Upon recrystallization of the extensions, the layer of material is removed, and the FET device is completed using known processing techniques. The above process eliminates the lithography and ion implantation steps normally required for source and drain extension formation, and thereby reduces the manufacturing costs of field-effect transistors.

21 Claims, 4 Drawing Sheets

LASER THERMAL PROCESS FOR FABRICATING FIELD-EFFECT TRANSISTORS

FIELD OF THE INVENTION

The present invention relates to processes for fabricating semiconductor field-effect transistors, and in particular to such processes involving laser thermal processing.

BACKGROUND OF THE INVENTION

Laser thermal processing (LTP) involves using short pulses of laser radiation (e.g., on the order of nanoseconds to tens of nanoseconds) to thermally anneal and activate dopants in a semiconductor. The pulses of laser radiation provide sufficient heat to briefly melt the doped semiconductor, which allows the dopants to diffuse within the molten region. When the semiconductor cools, it recrystallizes with the electrically active dopants occupying lattice sites within the crystal.

LTP techniques can be used to form junctions and source and drain (S/D) extension regions of a field-effect transistor (FET). Junctions formed using LTP techniques are shallow, abrupt and have low resistance, which are all very desirable device characteristics. In addition, because of the extremely high heating and cooling rate involved in LTP ($10^6-10^{12\circ}$ K/s), a meta-stable state can be established where dopant activation above the solid solubility limit occurs. These properties allow a transistor to be scaled to a smaller dimension with improved performance.

Incorporated by reference herein is the article by Talwar et al., "Ultra-Shallow, Abrupt, and Highly Activated Junctions by Low-energy Ion Implantation and Laser Annealing," Proceedings of the $13^{th}$ International Conference on Ion Implantation Technology, pp. 1171–1174 (1999), the article by Talwar et al., "Laser Thermal Processing for Shallow-Junction and Silicide Formation," Proceedings of the SPIE, Microelectronic Device Technology II, volume 3506, p. 74–81 (1998), and the article by Goto et al., "Ultra-Low Contact Resistance for Deca-nm MOSFETs by Laser Annealing," IEDM Digest, paper 20.7.1, pp. 931–933 (1999). These articles describe applications of LTP to semiconductor fabrication. Also incorporated by reference is U.S. Pat. No. 5,956,603, entitled "Gas Immersion Laser Annealing Process Suitable for Use in the Fabrication of Reduced-Dimension Integrated Circuits," and U.S. Pat. No. 5,908,307, entitled "Fabrication Processes for Reduced-Dimension FET Devices."

Unfortunately, LTP techniques cannot be directly inserted into the conventional complimentary metal-oxide-semiconductor (CMOS) fabrication process flow. This is because in the conventional process flow, deep source/drain regions need to be formed to make the contacts so that the transistors can be connected to each other to form a functional circuit. The formation of deep source/drain regions requires a high-temperature rapid thermal annealing (RTA) step to activate the implanted dopant. The RTA process is typically performed at a temperature of about 1000° C. for a duration of several tens of seconds. The RTA process is also used to activate and diffuse the dopants in the poly gate to decrease the poly resistance and eliminate the poly depletion problem. Such high RTA temperatures, however, cause the dopants in the laser-annealed shallow source/drain regions to out-diffuse into the silicon substrate. This results in deeper and less abrupt junctions, which degrades device performance. In addition, electrically active dopants in a meta-stable state (i.e., above the solid-solubility limit) can also deactivate (i.e., precipitate and become electrically inactive), resulting in higher electrical resistance and thus diminished device performance.

The prior art contains a technique that can be used to avoid the degradation of LTP junctions caused by post-LTP thermal process. The idea is to limit the post-LTP thermal budget by forming deep source/drain regions before LTP of the shallow source/drain extensions. This can be done using a so-called disposable spacer process (DSP), as described in the article by Yu et al, "70 nm MOSFET with Ultra-Shallow, Abrupt, and Super-Doped S/D Extension Implemented by Laser Thermal Process," IEDM Digest, paper 20.4.1, pp. 509–511 (1999). In the process described in the Yu article, an additional dielectric layer is deposited and etched back to form a disposable spacer. This spacer is used to self-align the deep source/drain dopant implant and is subsequently removed. While working devices have been demonstrated with this approach, it requires additional steps, which add to the process complexity and thus increases the manufacturing costs.

Accordingly, it would be desirable to have a non-complex LTP-based CMOS process flow that does not compromise the above-mentioned desired LTP junction characteristics.

SUMMARY OF THE INVENTION

The present invention relates to processes of fabricating semiconductor field-effect transistors, and in particular to such processes involving laser thermal processing.

Accordingly, a first aspect of the present invention is a process for fabricating a field-effect transistor semiconductor device from a semiconductor substrate having an upper surface, spaced apart shallow trench isolations, and a gate formed on the upper surface between the shallow trench isolations. The process includes the step of forming removable first dielectric spacers on respective sides of the gate. The next step involves implanting dopants into the substrate in respective first and second regions between the spacers and the shallow isolation trenches. The third step involves annealing the first and second regions to form an active deep source and an active deep drain. The next step involves removing the removable spacers. A blanket pre-amorphization implant is then performed to form amorphized source and drain regions that include extension regions that extend up to the gate. The next step then includes depositing at least one layer of material (referred to as a "stack" herein) over at least the source and drain extensions, wherein the stack is opaque to a select wavelength of laser radiation. The next step is then irradiating the stack with laser radiation having the select wavelength so as to selectively melt the amorphized source and drain extension regions but not the underlying crystalline substrate. This LTP step causes diffusion of dopants from the deep source and drain into the source and drain extensions. The next step is the removal of the stack.

A second aspect of the present invention involves completing the formation of the MOSFET structure by forming first and second permanent dielectric spacers on the first and second sides of the gate, respectively, and then forming electrical contacts atop the gate, the source and the drain.

A third aspect of the present invention is a MOSFET device product-by-process, made using the process summarized immediately above and described in more detail below.

DETAILED DESCRIPTION OF THE INVENTION

The present invention relates to processes of fabricating semiconductor field-effect transistors, and in particular to such processes involving laser thermal processing.

Figure 1:
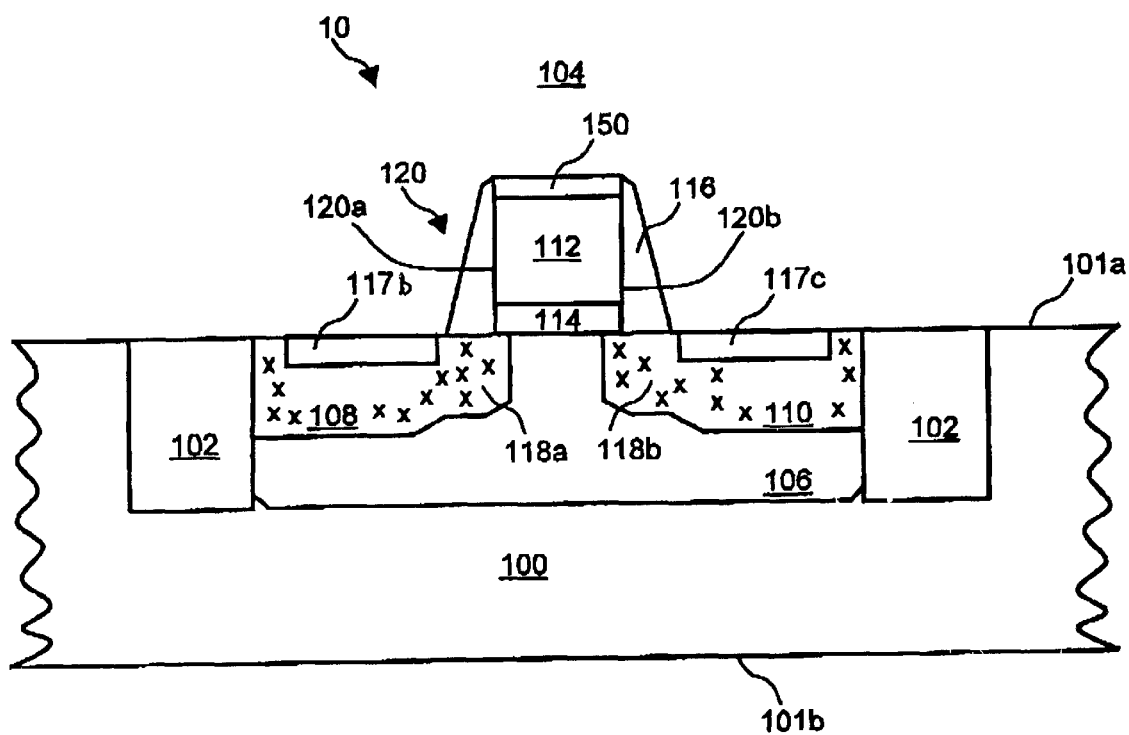
FIG. 1 is a schematic diagram of a metal oxide semiconductor field effect transistor (MOSFET) that results from performing the process steps of the present invention as illustrated in FIGS. 2A–2H.

Referring to FIG. 1, a semiconductor structure 10 includes a silicon substrate 100 having an upper surface 101a and a bottom surface 101b. On upper surface 101a of substrate 100, a metal oxide semiconductor field effect transistor (MOSFET) 104 is formed using the process of the present invention, as described in greater detail below. MOSFET 104 is isolated from other devices that may be also formed on the silicon substrate 100 by isolation elements 102. MOSFET 104 is shown to include an N well 106, a P+ source 108, a P+ drain 110 and a gate layer 112 (MOSFET 104 could also alternatively include a P well and a N+ source 108 and a N+ drain 110). Gate layer 112 is formed on upper surface 101a of substrate 100 and is insulated from well 106 by a gate insulation layer 114. Gate layer 112 and insulation layer 114 are collectively referred to herein as "gate 120." Electrical contacts 117a, 117b and 117c are formed on top of gate 120, the P+ source 108 and the P+ drain 110, respectively. Dielectric sidewall spacers 116 help achieve self-alignment of the position of the electrical contacts, and also prevent electrical shorts between gate 120 and P+ source 108 and P+ drain 110 upon silicidation. Source 108 and drain 110 couple to the channel region (CR) below gate 120 via shallow source and drain extensions 118a and 118b, respectively. In one example of MOSFET 104, gate layer 112 has a height of approximately 2000 Angstroms, shallow extensions 118a and 118b have a depth of approximately 200 to 500 Angstroms, and source 108 and drain 110 have a depth of about 500–1000 Angstroms.

Figure 2A:
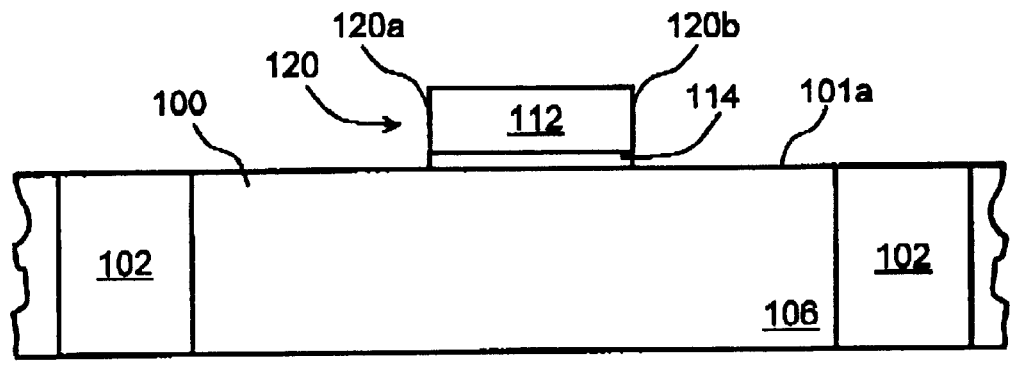
FIG. 2A is a cross-sectional schematic diagram of a silicon substrate having formed therein shallow isolation elements and a gate on the upper surface of the substrate.

Referring to FIG. 2A, a process of fabricating MOSFET 104 of FIG. 1 according to the method of the present invention includes first forming spaced apart shallow isolation elements 102 to electrically isolate an area of silicon substrate 100 in which the MOSFET device is to be formed. Isolation elements 102 are formed by first etching spaced apart trenches into upper surface 101a of silicon substrate 100 and then filling the trenches with an insulating material. In one example, the insulating material is an oxide such as silicon dioxide. Upper surface 101a of silicon substrate 100 is then chemical-mechanical polished, resulting in a planarized upper surface.

After the formation of the isolation elements 102, a gate insulation layer 114 is formed on the upper surface 101a of silicon substrate 100 in an area between isolation elements 102. On top of gate insulation layer 114, a gate layer 112 is deposited. In one example, the gate insulator layer is $SiO_2$ and gate layer 112 is polycrystalline-silicon deposited via low pressure chemical vapor deposition to a thickness of about 2000 Angstroms. Another exemplary material for gate layer 112 is amorphous silicon. In alternative embodiments, gate layer 112 could be a metal or a metal compound such as tungsten, tungsten silicide, tungsten nitride, tantalum, tantalum nitride, titanium, titanium nitride and platinum. Gate insulation layer 114 and gate layer 112, as mentioned above, form what is called simply gate 120. Gate 120 has first and second sides 120a and 120b.

Figure 2B:
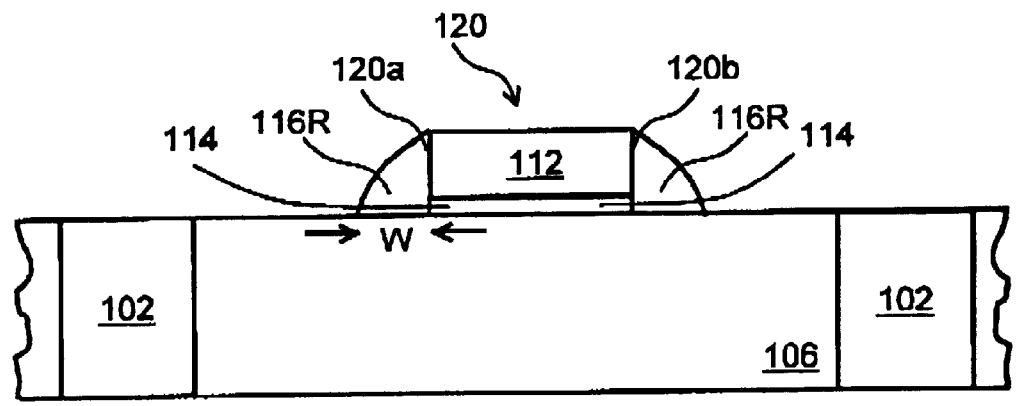
FIG. 2B is a cross-sectional diagram of the silicon substrate of FIG. 2A, further including removable sidewall spacers.

With reference now to FIG. 2B, the next step in the process of the present invention involves forming removable ("disposable") sidewall spacers 116R on either side 120a and 120b of gate 120. A preferred method for forming sidewall spacers 116R involves depositing a dielectric layer and anisotropically etching back that layer. The etch stops at upper surface 101a of silicon substrate 100. Examples of dielectric materials for forming sidewall spacers 116R include silicon oxide or silicon nitride. Sidewall spacers 116R have a width W at the base, preferably on the order of 100–1000 Angstroms. The width W of the spacers allows for the formation of deep source and deep drain regions that are spaced apart from the gate by a predetermined distance, as discussed below.

Figure 2C:
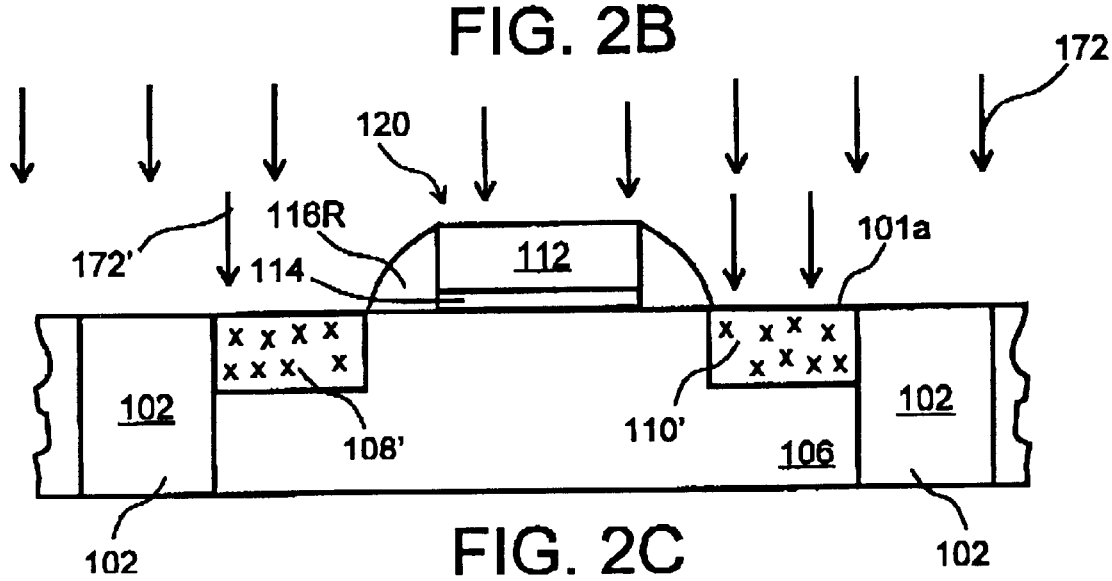
FIG. 2C is a cross-sectional diagram of the silicon substrate of FIG. 2B, showing the step of performing a deep dopant implant and an optional shallow dopant implant.

With reference now to FIG. 2C, the next step in the process involves doping first and second regions 108' and 110' of silicon substrate 100, located between gate 120 and isolation elements 102, with appropriate N– or P– type dopants, as indicated by dopant implant beam 172. Regions 108' and 110' will ultimately become source 108 and drain 110, respectively, of MOSFET 104 (see FIG. 1). The implants are self-aligned to sidewall spacers 116R Doping of regions 108' and 110' is performed using P– type dopant ions (e.g., boron, aluminum, gallium) or N-type dopant ions (e.g., phosphorous, arsenic, antimony) from an ion implanter, such as the 9500 XR ION IMPLANTER™, commercially available from Applied Materials, Inc., Santa Clara, Calif. The ions are accelerated to a given energy level (e.g., 200 eV to 40 KeV) and implanted in regions 108' and 110' through upper surface 101a to a given dose (e.g., about $1 \times 10^{14}$ atoms/cm$^2$ to $1 \times 10^{16}$ atoms/cm$^2$). Regions 108' and 110' have, in practice, a concentration of dopant that is graded with depth into substrate 100 from upper surface 101a, and is typically between $10^{19}$–$10^{21}$ ions/cm$^3$. If well 106 is – type, regions 108' and 110' are doped with P– type dopants. On the other hand, if well 106 is P– type, then regions 108' and 110' are doped with N– type dopants.

With continuing reference to FIG. 2C, an optional shallow dopant implant, as indicated by arrows 172', may also be performed. The purpose of shallow dopant implant 172' is to increase the surface concentration of dopant so that more dopant can diffuse to extension regions 118a and 118b (see FIG. 1) during the LTP step, described below. This leads to lower extension resistance. For a typical CMOS process, two lithography steps, (namely, coating the surface with photoresist, and then exposing and developing the resist to form a mask) are necessary before implantation to separately define P– type and N– type source and drain regions 108' and 110'.

Figure 2D:
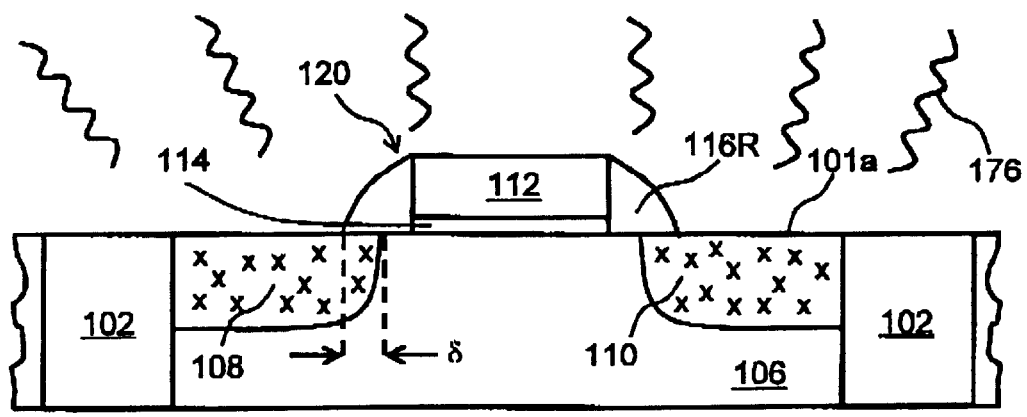
FIG. 2D is a cross-sectional diagram of the silicon substrate of FIG. 2C, after the step of performing RTA.

With reference now to FIG. 2D, the next step in the process involves performing RTA to activate the dopants implanted in regions 108' and 110' (see FIG. 2C), thereby forming (deep) source 108 and (deep) drain 110. Typical RTA temperatures range from 900° C. to 1050° C. Wavy lines 176 in FIG. 2D indicate the application of annealing heat. The high temperature thermal cycle drives the dopant out laterally by a small distance δ. The temperature and anneal time should be controlled so that this lateral dopant out-diffusion does not exceed the width W of sidewall spacers 116R.

Figure 2E:
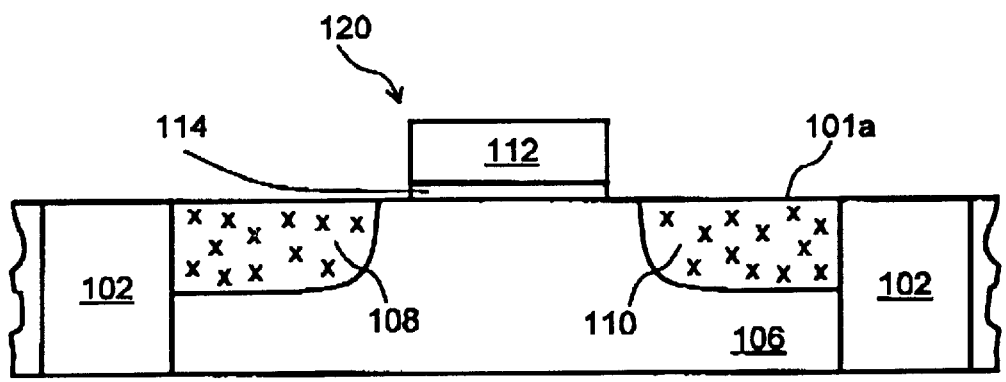
FIG. 2E is a cross-sectional diagram of the silicon substrate of FIG. 2D, but with the removable spacers removed.

With reference now to FIG. 2E, removable sidewall spacers 116R are removed, preferably using either a wet or dry etch process. This step could be performed prior to the RTA step associated with FIG. 2D.

Figure 2F:
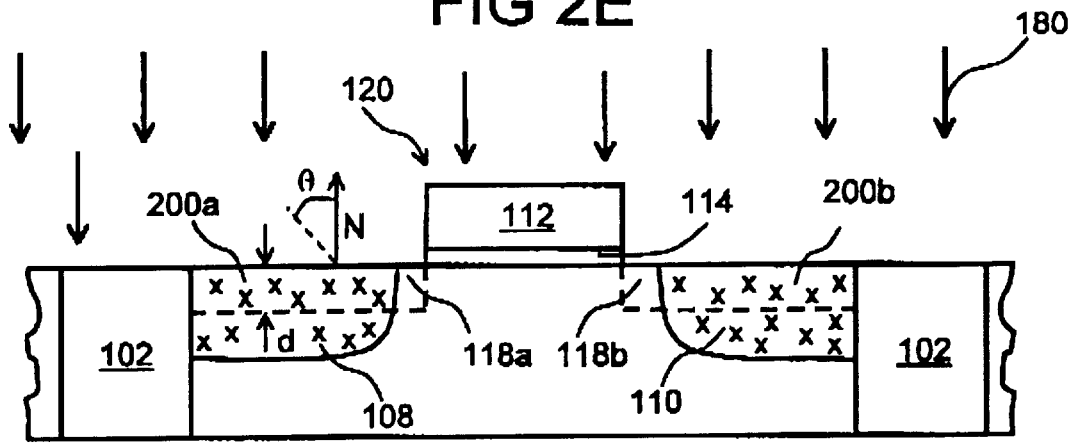
FIG. 2F is cross-sectional diagram of the silicon substrate of FIG. 2E, showing the process step of performing a pre-amorphization implant (PAI)

With reference now to FIG. 2F, the next step in the process involves performing a blanket pre-amorphization implant (PAI) as indicated by arrows 180, resulting in amorphous regions 200a and 200b (i.e., amorphous source and drain regions, respectively), being formed in the upper portion of silicon substrate 100 between gate 120 and isolation elements 102, as indicated by the dashed line. Amorphous regions 200a and 200b include respective source and drain extensions 118a and 118b that extend up to gate 120.

The PAI depth d of regions 200a and 200b determines the depth of the laser melt in silicon substrate 100 during the LTP step (described below), which in turn determines the junction depth of source and drain extensions 118a and 118b (see FIG. 1). The PAI implant depth is determined by the implant species, dose, and energy, and may be performed to achieve a predetermined depth for extensions 118a and 118b. Preferred PAI species include Si and Ge. By way of example, a Si implant having a dose of $10^{15}$ atoms/cm$^2$ at an energy of 10 keV will amorphize silicon substrate 100 to a depth of about 240 Angstroms. Likewise, a Ge implant having a does of $3\times10^{14}$ atoms/cm$^2$ at an energy of 20 keV will amorphize silicon substrate 100 to a depth of about 300 Angstroms. Depending on the desired amorphization depth, d, the typical implant dose is in the range from about $10^{13}$ atoms/cm$^2$ to about $10^{16}$ atoms/cm$^2$, while the range of implant energy is from about 5 keV to about 400 keV.

The PAI implant is self-aligned to sides 120a and 120b of gate 120. However, though not shown explicitly in FIG. 2F, amorphous regions 200a and 200b typically extend slightly underneath gate 120 due to the lateral straggle of the PAI process. This overlap of gate 120 with amorphous regions 200a and 200b can impact device performance and can be controlled by varying the tilt angle θ of the PAI implant with respect to the normal vector of upper surface 101a of silicon substrate 100 (the tilt angle in FIG. 2F, for example, is 0°). The tilt angle θ should be selected based on the overlap specification that yields optimal device performance.

Figure 2G:
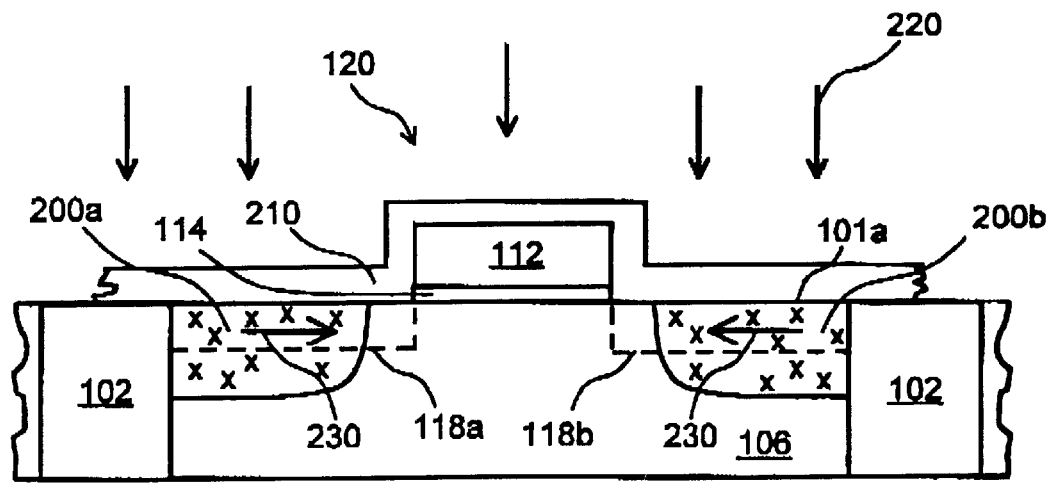
FIG. 2G is cross-sectional diagram of the silicon substrate of FIG. 2F, further including a stack comprising one or more absorbing layers deposited on the upper surface of the substrate, and the process step of performing LTP.

With reference now to FIG. 2G, the next step in the process involves forming at least one layer of material (hereinafter, referred to as a "stack") 210 on upper surface 101a and covering at least source and drain regions 108 and 110 (see FIG. 2F). Of the one or more layers of material constituting stack 210, at least one of the layers is a material that is opaque to a select wavelength of radiation used to perform LTP, as described below. Such opaque materials may include metals, metal oxides, metal nitrides, tungsten, tantalum or the like, so long at the material has a melting temperature higher than that of silicon. An exemplary stack 210 comprises a thin layer (e.g., 150 Angstroms) of silicon dioxide deposited directly on upper surface 101a, and a relatively thick layer (e.g., 300 Angstroms) of tantalum nitride formed atop the silicon dioxide layer. The role of the silicon dioxide layer in this case is to prevent contamination of silicon substrate 100 (including source 108 and drain 110) that could result if tantalum nitride were in direct contact with upper surface 101a of the silicon substrate. The purpose of stack 210 is to facilitate the absorption of LTP radiation and the uniform distribution of heat from the radiation. The layers also serve to maintain the physical integrity of the semiconductor structure during processing.

With continuing reference to FIG. 2G, the next step in the process involves performing LTP by irradiating stack 210 with laser radiation, indicated by arrows 220. The laser radiation is preferably provided in pulses. The laser radiation preferably has a fluence from about 0.05 to 1 Joule/cm$^2$, and a select wavelength in the range from about 157 nanometers to about 1,064 nanometers. The laser radiation is controlled such that the entirety of amorphous regions 200a and 200b are melted, but the underlying portion of the crystalline silicon substrate 100 (i.e., well 106) is not. This is possible because the melt temperature of crystalline silicon is about 250° C. higher than that of amorphous silicon. When amorphous regions 200a and 200b are molten, dopants in source 108 and drain 110 diffuse laterally into the molten extension regions 118a and 118b as indicated by arrows 230. The diffusion stops sharply at the liquid-solid interface that exists underneath sides 120a and 120b of gate 120. This abrupt interface is possible because the diffusivity of the dopants in solid silicon is eight orders of magnitude lower than that in liquid (molten) silicon. The dopant diffusion length, L, in molten silicon is give by L=2(Dô)$^{1/2}$, where D is the dopant diffusion coefficient in liquid silicon and ô is the melt duration, which is of the order of the temporal pulse length of the laser radiation. For boron, D is about $2.5\times10^{-6}$ cm$^2$/sec. To ensure that the dopants will diffuse all the way to the edge of the molten amorphous regions 200a and 200b under the gate, the dopant diffusion length, L, in molten silicon must be greater than the difference between the width of the removable spacer 116R (see FIG. 2D) and the lateral out-diffusion of source and drain 108 and 110. As mentioned above, width, W, of spacer 116R at its base is several hundred Angstroms. The temporal pulse length of the laser radiation pulse is on the order of tens of nanoseconds. It is important to note that in conventional CMOS fabrication process flow, as well as in the prior art pertaining to LTP processing, shallow extensions (e.g., extensions 118a and 118b) are formed using low-energy ion implantation. For CMOS devices, two lithography steps are necessary before implanting to separately define the P– type and N– type extension regions, as mentioned above. By contrast, in the present invention, (shallow) doped extensions 118a and 118b are formed by melting amorphized silicon regions 200a and 200b so that dopants in (deep) source 108 and (deep) drain 110 laterally diffuse from the deep source into the source extension and from the deep drain into the drain extension. Thus, the process of the present invention eliminates two ion implantation steps and two lithography steps associated with forming the extensions. The lithography step, including mask generation, resist coating, photo exposure, resist develop, resist strip, is typically an expensive process. The cost reduction in elimination of two lithography steps is enough to offset the added process complexity due to disposable spacer. The cost saving and process simplification are two of the key advantages the current invention has over the prior art of LTP process.

Figure 2H:
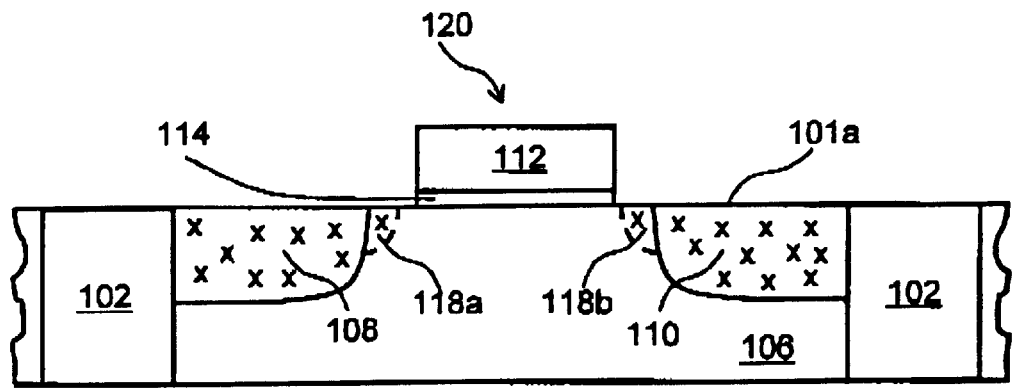
FIG. 2H is cross-sectional diagram of the silicon substrate of FIG. 2G, with the stack removed, and showing the formation of the doped extension regions.

With reference now to FIG. 2H, stack 210 is removed by using a wet or dry etch.

With reference again to FIG. 1, the next step in the process involves forming new and permanent dielectric spacers 116 on the sides 120a and 120b of gate 120. The process further includes forming electrical contact 117a atop gate 120 and electrical contacts 117b, 117c on upper surface 101a of the silicon substrate 100 and contacting source 108 and drain 110. Electrical contacts 117a–117c may be formed from silicide such as titanium disilicide, cobalt disilicide or nickel monosilicide, or may be formed by direct metal deposition using sputtering, evaporation or chemical vapor deposition.

The many features and advantages of the present invention are apparent from the detailed specification, and, thus, it is intended by the appended claims to cover all such features and advantages of the described apparatus that follow the true spirit and scope of the invention. Furthermore, since numerous modifications and changes will readily occur to those of skill in the art, it is not desired to limit the invention to the exact construction and operation described herein. Accordingly, other embodiments are within the scope of the appended claims.

What is claimed is:

1. A process for fabricating a field-effect transistor semiconductor device from a semiconductor substrate having an upper surface, spaced apart shallow trench isolations, and a gate with first and second sides formed on the upper surface between the shallow trench isolations, comprising the steps of:
   a) forming first and second removable first dielectric spacers on the first and second sides of the gate, respectively;
   b) implanting dopants into the substrate in respective first and second regions between the spacers and the shallow isolation trenches;
   c) annealing said first and second regions so as to form an active deep source and an active deep drain;
   d) removing the removable spacers;
   e) performing a pre-amorphization implant to form, within the substrate adjacent the upper surface of the substrate above the deep source and deep drain, amorphized source and drain regions each with extensions that extend up to the gate;
   f) depositing at least one layer of material over at least the amorphized source and drain regions wherein the at least one layer is opaque to a select wavelength of radiation energy;
   g) irradiating the at least one layer with laser radiation having said select wavelength so as to selectively melt the amorphized source and drain regions but not the underlying crystalline substrate; and
   h) removing the at least one layer of material.

2. A process according to claim 1, further including the step, after said step h), of:
   i) forming first and second permanent dielectric spacers on the first and second sides of the gate, respectively; and
   ii) forming electrical contacts atop the gate and atop the source and drain.

3. A process according to claim 1, further including in said step b), the step of:
   i) performing a shallow dopant implant.

4. A process according to claim 1, wherein said annealing step c) involves performing rapid thermal annealing.

5. A process according to claim 1, wherein said laser radiation is pulsed.

6. A process according to claim 5, wherein said pulsed laser radiation has a fluence from about 0.05 to 1 Joule/cm$^2$.

7. A process according to claim 5, wherein said pulsed laser radiation has a select wavelength in the range from about 157 nanometers to about 1,064 nanometers.

8. A process according to claim 5, wherein the temporal pulse length of the pulsed laser radiation is such that the dopant diffusion length in molten silicon is greater than the difference between the removable spacer width and the lateral out-diffusion of the source and/or drain during the annealing step of said step b).

9. A process according to claim 1, wherein in said step g), dopants in the source and drain diffuse laterally into the respective molten source and drain extensions.

10. A process according to claim 1, further including the step of performing the pre-amorphization implant of said step e) to achieve a predetermined junction depth of the source and drain extension regions.

11. A process according to claim 1, wherein said step d) is performed prior to said step c).

12. A process according to claim 1, further including the step of performing said pre-amorphization implant at a tilt angle with respect to the normal of the substrate surface.

13. A process according to claim 1, wherein in said step f), the step of depositing at least one layer of material includes the steps of depositing a first oxide layer and a second layer of opaque material.

14. A process according to claim 13, wherein step of depositing the first oxide layer includes depositing silicon dioxide, and the step of depositing a second opaque layer includes depositing tantalum nitride.

15. A field-effect transistor product by process formed from a semiconductor substrate having an upper surface, spaced apart shallow trench isolations, and a gate with first and second sides formed on the upper surface between the shallow trench isolations, the product formed by the process comprising the steps of:
   a) forming first and second removable first dielectric spacers on the first and second sides of the gate, respectively;
   b) implanting dopants into the substrate in respective first and second regions between the spacers and the shallow isolation trenches;
   c) annealing said first and second regions so as to form an active deep source and an active deep drain;
   d) removing the removable spacers;
   e) performing a pre-amorphization implant to form amorphized source and drain regions each with extensions that extend up to the gate, within the substrate adjacent the upper surface of the substrate above the deep source and deep drain;
   f) depositing at least one layer of material over at least amorphized source and drain regions wherein the at least one layer is opaque to a select wavelength of radiation energy;
   g) irradiating the at least one layer with laser radiation having said select wavelength so as to selectively melt the amorphized source and drain regions but not the underlying crystalline substrate; and
   h) removing the at least one layer of material.

16. A process of forming shallow doped source and drain extensions in a field-effect transistor formed in a silicon substrate having an upper surface and a gate with first and second sides formed on the substrate upper surface, comprising the steps of:

a) performing a deep dopant implant to form deep source and deep drain regions in the portion of silicon substrate on respective sides of the gate but at a predetermined distance from the gate;

b) activating the dopants in the source and drain;

c) pre-amorphizing regions within the silicon substrate near the upper surface above the source and drains, the pre-amorphized regions including shallow source and drain extensions that extend even with the sides of the gate;

d) melting the pre-amorphized regions, including the source and drain extensions, but not the underlying deep source and deep drain, so as to allow dopants to diffuse into the source extension from the deep source and into the drain extension from the deep drain.

17. A process according to claim 16, wherein said step d) includes the steps of:

i) depositing a layer of material over the pre-amorphized regions, the layer being opaque to a select wavelength of radiation; and ii) irradiating the layer with laser radiation having the select wavelength.

18. A process according to claim 16, wherein said step b) involves performing rapid thermal annealing.

19. A process according to claim 16, further including the step, after said step a), of performing a shallow dopant implant.

20. A process according to claim 16, wherein said step a) includes the step of forming removable dielectric spacers on the sides of the gate having a width corresponding to said predetermined distance.

21. A process according to claim 20, wherein said step c) includes the step of removing said removable dielectric spacers.

* * * * *